(12) United States Patent
Chen et al.

(10) Patent No.: US 12,727,126 B2
(45) Date of Patent: Sep. 1, 2026

(54) LEAK DETECTION AND PROTECTION SYSTEM FOR LIQUID COOLING

(71) Applicant: Quanta Computer Inc., Taoyuan City (TW)

(72) Inventors: Yi-Chieh Chen, Taoyuan City (TW); Te-Chuan Wang, Taoyuan City (TW); Shao-Yu Chiu, Taoyuan City (TW); Tzu-Hsuan Hsu, Taoyuan City (TW)

(73) Assignee: Quanta Computer, Inc., Taoyuan City (TW)

( * ) Notice: Subject to any disclaimer, the term of this patent is extended or adjusted under 35 U.S.C. 154(b) by 266 days.

(21) Appl. No.: 18/651,202

(22) Filed: Apr. 30, 2024

(65) Prior Publication Data

US 2025/0338457 A1 Oct. 30, 2025

(51) Int. Cl.

| | |
|---|---|
| ***H05K 7/20*** | (2006.01) |
| ***G01M 3/16*** | (2006.01) |
| ***G05D 7/06*** | (2006.01) |
| ***G06F 1/20*** | (2006.01) |

(52) U.S. Cl.

CPC ........ *H05K 7/20836* (2013.01); *G01M 3/165* (2013.01); *G05D 7/0635* (2013.01); *G06F 1/20* (2013.01); *H05K 7/20254* (2013.01); *H05K 7/20272* (2013.01); *H05K 7/20781* (2013.01)

(58) Field of Classification Search

CPC ........... H05K 7/20836; H05K 7/20254; H05K 7/20272; H05K 7/20781

USPC ..................................................... 361/679.53

See application file for complete search history.

(56) References Cited

U.S. PATENT DOCUMENTS

| | | | | |
|---|---|---|---|---|
| 2006/0065874 | A1* | 3/2006 | Campbell | H05K 7/20772 251/348 |
| 2022/0369514 | A1* | 11/2022 | Heydari | H05K 7/20272 |
| 2022/0390195 | A1* | 12/2022 | Gao | F28F 27/02 |
| 2022/0404079 | A1* | 12/2022 | Franz | H05K 7/20781 |
| 2023/0063710 | A1* | 3/2023 | Gao | H05K 7/20509 |
| 2023/0068535 | A1* | 3/2023 | Chen | G06F 1/20 |
| 2023/0114730 | A1* | 4/2023 | Sprenger | G06F 11/3006 |
| 2024/0023276 | A1* | 1/2024 | Patel | H05K 7/20272 |

FOREIGN PATENT DOCUMENTS

| | | | | |
|---|---|---|---|---|
| KR | 20110019455 A | * | 2/2011 | F16K 11/0873 |

* cited by examiner

*Primary Examiner* — Zhengfu J Feng
(74) *Attorney, Agent, or Firm* — Nixon Peabody LLP

(57) ABSTRACT

A coolant leak detection and protection system for rack mounted servers is disclosed. The system includes an inlet coolant tube and a feeder coolant tube for supplying coolant to a cold plate that is thermally in contact with a heat generating component. An outlet coolant tube collects coolant from the cold plate. A three-way valve has a first port coupled to the inlet coolant tube, a second port coupled to the feeder coolant tube, and a third port coupled to a bypass tube fluidly connected to the outlet coolant tube. A controller is coupled to a leak sensor and the three-way valve. The controller is operable to detect a leak based on a signal from the leak sensor. The controller controls the three-way valve to fluidly connect the second port to the third port to cut off coolant flow from the inlet coolant tube when a leak is detected.

20 Claims, 6 Drawing Sheets

LEAK DETECTION AND PROTECTION SYSTEM FOR LIQUID COOLING

TECHNICAL FIELD

The present invention relates generally to liquid cooling systems, and more specifically, to a leak detection and protection system that includes a coolant leak detector and a three-way valve that allows isolated shutdown of a computing device and coolant flow on detection of a leak.

BACKGROUND

Electronic components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a mechanical fan system on the server.

Due to the improvement of high-performance systems, the amount of heat that needs to be removed becomes higher with each new generation of electronic components. For example, advancements in semiconductor technology have led to the development of powerful central processing units (CPUs) and graphics processing units (GPUs). While innovations in CPUs and GPUs have significantly boosted computational power, they also have resulted in higher thermal loads such as 400 W for CPUs and 800 W for GPUs or more. Air cooling is increasing insufficient to maintain optimal operating temperatures. To address the escalating heat challenge, the industry has turned to liquid cooling systems. At room temperature, the heat transfer coefficient of air is only 0.024 W/mK, while a coolant, such as water, has a heat transfer coefficient of 0.58 W/mK, which is 24 times than that of air. Thus, liquid cooling is more effective in transporting heat away from a heat source to a radiator. Liquid cooling also allows heat removal from critical parts without noise pollution generated by fans.

Liquid cooling systems typically include cold plates, a coolant distribution unit (CDU) or a reservoir and pumping unit (RPU) that circulate coolant to the cold plates to absorb and remove the heat generated by CPUs and GPUs. Liquid cooling has proven to be more efficient than traditional air cooling, thus allowing servers to operate at peak performance without the risk of overheating. Liquid cooling is therefore the currently accepted solution for rapid heat removal due to the superior thermal performance from liquid cooling.

FIG. 1 is a top view of a prior art server 10 that includes heat-generating components requiring liquid cooling. The server 10 includes a chassis 12 that has a circuit board 14 mounting components such as a CPU chip (not shown). In this example, a cold plate 16 is mounted over heat-generating electrical components, such as the CPU chip, to transfer heat away from the component. The coolant is circulated internally in the cold plate 16 to carry away heat generated from the processor under the cold plate 16. The chassis 12 includes coolant tubes 20 and 22 that may each be fluidly connected to a rack mounted heat exchanger. The inlet coolant tube 20 supplies coolant to the cold plate 16 from a cold manifold 50 via a quick connect fitting 24, while the outlet coolant tube 22 collects heated coolant from the cold plate 16 and returns the heated coolant to a hot manifold 52 via a quick connect fitting 26.

In liquid cooling systems, one significant concern is the potential for coolant leaks. Coolant leaks from the cold plate or coolant tubes in a server can potentially lead to short circuits, hardware damage, and resulting data loss. Generally, the server chassis 12 is equipped with leakage detection sensors to detect coolant leaks. In this example, a pair of cable type leak sensors 30 and 32 are strung out over the surface of the circuit board 14 in respective proximity to the coolant tubes 20 and 22. The leak sensors 30 and 32 each have internal positive and negative poles that may be electrically connected by liquid contacting an exterior wall of the sensor. There are two copper-plated coils (positive and negative) in the cable type leak sensors 30 and 32 that are combined with the non-woven fabric of the walls of the sensors. When coolant contacting any part of the exterior wall reaches a threshold volume, such as at least 0.3 ml in volume, the coolant causes conduction between the two poles and changes the resistance of the cable type leak sensor, thus indicating a coolant leak. The detected change in resistance may trigger an alert from a controller that may shut down the server 10 to prevent damage from other key components in the system.

FIG. 2A shows a rack system 40 that holds a series of servers 42 including the server 10 shown in FIG. 1. Each of the servers 42 include a cold plate or cold plates such as the cold plate 16 in FIG. 1. The cold plates of the servers 42 are each fluidly coupled via coolant tubes to a cold manifold 50 that supplies coolant to each of the cold plates in the servers 42. The cold plates of the servers 42 are also each fluidly coupled to a hot manifold 52 via coolant tubes. The hot manifold 52 collects heated coolant from each of the cold plates of the servers 42.

In current rack level liquid cooling systems such as that in the rack system 40, the cooling liquid source includes a closed loop cooling system and an open loop cooling system to facilitate heat exchange. Known closed loop liquid cooling systems use heat exchange to cool hot water, which is heated from the operation of the servers 42. Heat is then removed from the hot water in the closed loop liquid cooling system via an open loop system such as a radiator in proximity to a fan wall. The radiator transfers heat from the heated liquid and thus results in cooler liquid to be circulated to the liquid flow pipe. An open loop air cooling system, such as a fan wall, generates air flow that carries away heat absorbed by the radiator of the heat exchanger.

When using liquid to cool the servers 42, a coolant distribution unit (CDU)/reservoir and pumping unit (RPU) 60 functions to circulate coolant into the servers 42, the manifolds 50 and 52, and through the external heat exchanger. As shown in FIG. 2A, during normal operation, all the servers 42 may be powered on and are cooled by the coolant circulated by the liquid cooling system. Each server 42 includes leak detection sensors such as the sensors 30 and 32 in FIG. 1. The leak detection sensors for each server 42 are typically monitored by a baseboard management controller (BMC) in each of the servers 42. When a leak is detected, the BMC sends a notification to the control system for the rack system 40.

FIG. 2B shows the state of the servers 42 in the rack system 40 when a leak is detected in one of the servers. If any of the cold plates or coolant tubes any of the servers 42 of rack 40 start to leak, the corresponding BMC will notify a central control system for the rack system 40. The central control system of the rack system 40 will then send a command to the corresponding BMCs to shut down all the servers 42. The central control system will also shut down the CDU/RPU 60. These measures are necessary to prevent coolant leaks that may make other servers in the rack system 40 short circuit or run at unsafe temperatures. After the CDU/RPU 60 is shut down, coolant in the liquid loop of the cold plates 16 and the manifolds 50 and 52 is drained until there is no coolant in the liquid cooling loop. Thus, as shown in FIG. 2B, all of the servers 42 and the CDU/RPU 60 are shut down. However, shut down of all of the servers 42 in the rack system 40 is burdensome for an operator as it compromises data center operations.

Thus, there is a need for a leak protection and detection design for liquid cooling solution when coolant leaks from a cold plate. There is a need for a leak protection system that prevents all servers in a rack from being shut down when a leak from one server is detected. There is a further need for a leak protection system that can drain coolant from a single isolated server while maintaining coolant flow to other servers.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an example coolant leak detection and protection system includes an inlet coolant tube for supplying coolant from a coolant source. A feeder coolant tube supplies coolant to a cold plate and an outlet coolant tube collects coolant from the cold plate. A three-way valve has a first port coupled to the inlet coolant tube, a second port coupled to the feeder coolant tube, and a third port coupled to a bypass tube fluidly connected to the outlet coolant tube. A controller coupled to the leak sensor and the three-way valve, the controller operable to determine a leak based on a signal from the leak sensor, control the three-way valve to fluidly connect the first port to the second port in normal operation, and control the three-way valve to fluidly connect the second port to the third port to cut off coolant flow from the inlet coolant tube when a leak is detected.

A further implementation of the example system is where the three-way valve is a ball valve. Another implementation is where the three-way valve includes a motor rotating the ball valve. Another implementation is where the leak sensor is cable type leak detector. Another implementation is where the controller shuts down a computing device when the leak is detected. Another implementation is where the controller is a baseboard management controller in communication with a rack management controller.

According to certain aspects of the present disclosure, an example computing device is disclosed. The computing device has a heat generating component and a cold plate in thermal contact with the heat generating component. An inlet coolant tube supplies coolant from a coolant source. A feeder coolant tube supplies coolant to the cold plate and an outlet coolant tube collects coolant from the cold plate. A three-way valve has a first port coupled to the inlet coolant tube, a second port coupled to the feeder coolant tube, and a third port coupled to a bypass tube fluidly connected to the outlet coolant tube. A controller is coupled to a leak sensor and the three-way valve. The controller is operable to determine a leak based on a signal from the leak sensor. The controller controls the three-way valve to fluidly connect the first port to the second port in normal operation. The controller controls the three-way valve to fluidly connect the second port to the third port to cut off coolant flow from the inlet coolant tube when a leak is detected.

A further implementation of the example computer device is where the controller is a baseboard management controller in communication with a rack management controller. Another implementation is where the three-way valve is a ball valve. Another implementation is where the three-way valve includes a motor rotating the ball valve. Another implementation is where the leak sensor is cable type leak detector. Another implementation is where the controller shuts down the heat generating component when the leak is detected. Another implementation is where the computing device is one of an application server, a storage server, a storage device, or a network switch. Another implementation is where the heat generating component is one of a central processing unit (CPU), a graphic processing unit (GPU), or a memory module.

According to certain aspects of the present disclosure, an example rack for holding computing devices requiring liquid cooling is disclosed. The rack includes a cold coolant manifold having fluid couplers and a hot coolant manifold having fluid couplers. A coolant distribution unit supplies cold coolant to the cold coolant manifold and collects hot coolant from the hot coolant manifold. The rack holds computing devices, each including a heat generating component and a cold plate in thermal contact with the heat generating component. Each computing device has an inlet coolant tube coupled to one of the fluid couplers of the cold coolant manifold for supplying coolant. Each computing device has a feeder coolant tube for supplying coolant to the cold plate and an outlet coolant tube coupled to one of the fluid couplers of the hot coolant manifold for collecting coolant from the cold plate. Each of the computing devices includes a three-way valve having a first port coupled to the inlet coolant tube, a second port coupled to the feeder coolant tube, and a third port coupled to a bypass tube fluidly connected to the outlet coolant tube Each of the computing devices includes a controller coupled to the leak sensor and the three-way valve, the controller operable to determine a leak based on a signal from the leak sensor, control the three-way valve to fluidly connect the first port to the second port in normal operation, and control the three-way valve to fluidly connect the second port to the third port to cut off coolant flow from the inlet coolant tube when a leak is detected.

A further implementation of the example rack includes a rack management controller in network communication with each of the controllers of the computing devices. Each controller is a baseboard management controller. Another implementation is where when a controller of a computing device of the computing devices detects a leak, the controller alerts the rack management controller and the remaining computing devices continue to operate. Another implementation is where the computing devices are one of an application server, a storage server, a storage device, or a network switch. Another implementation is where the heat generating component is one of a central processing unit (CPU), a graphic processing unit (GPU), or a memory module. Another implementation is where the three-way valve includes a motor rotating a ball valve.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
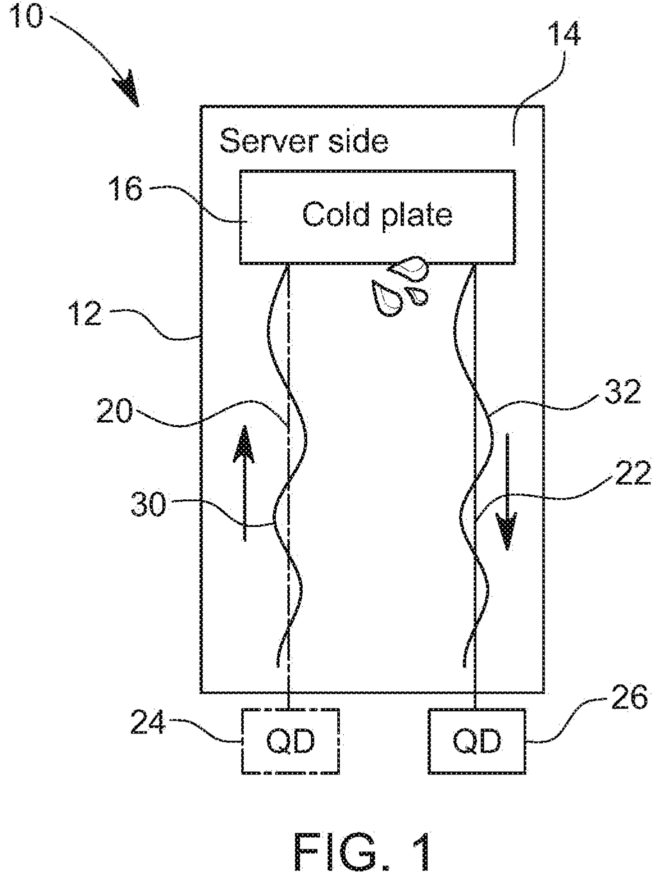
FIG. 1 is a top view of a prior art server having a liquid cooling system and cable type leak detection sensors.
Figure 2B:
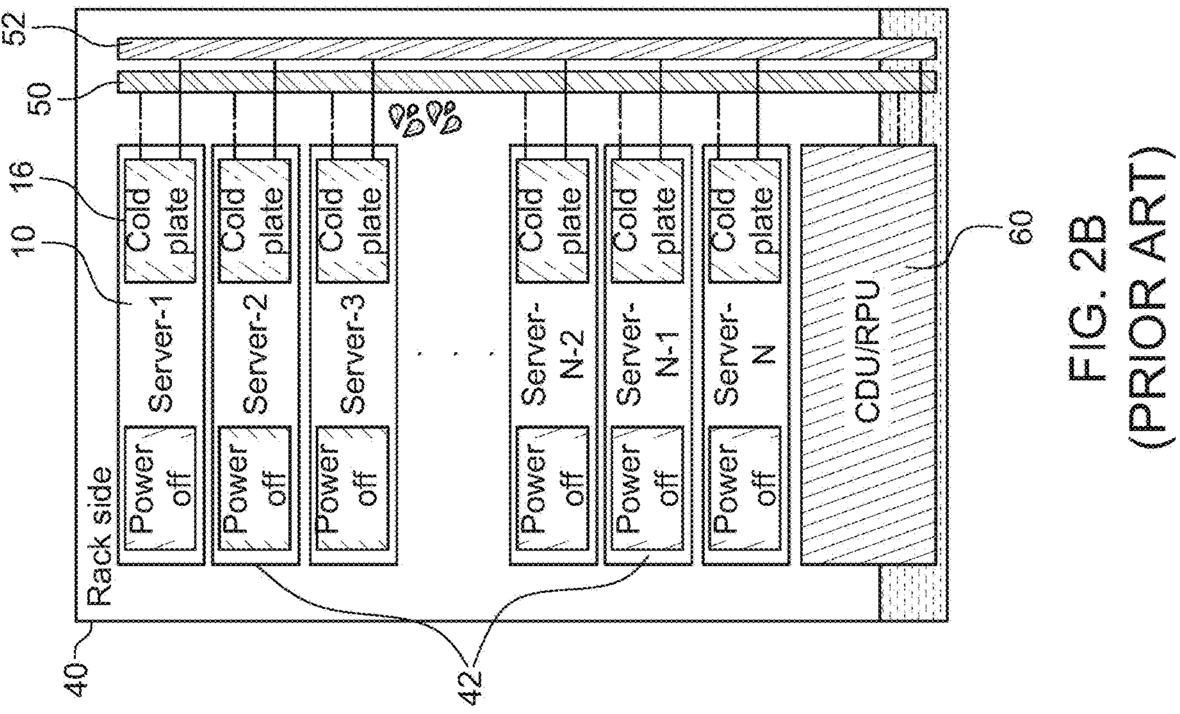
FIG. 2B is a side view of the prior art liquid cooled rack system in FIG. 2B that shows all servers being shut down when a leak is detected in one of the servers.
Figure 2A:
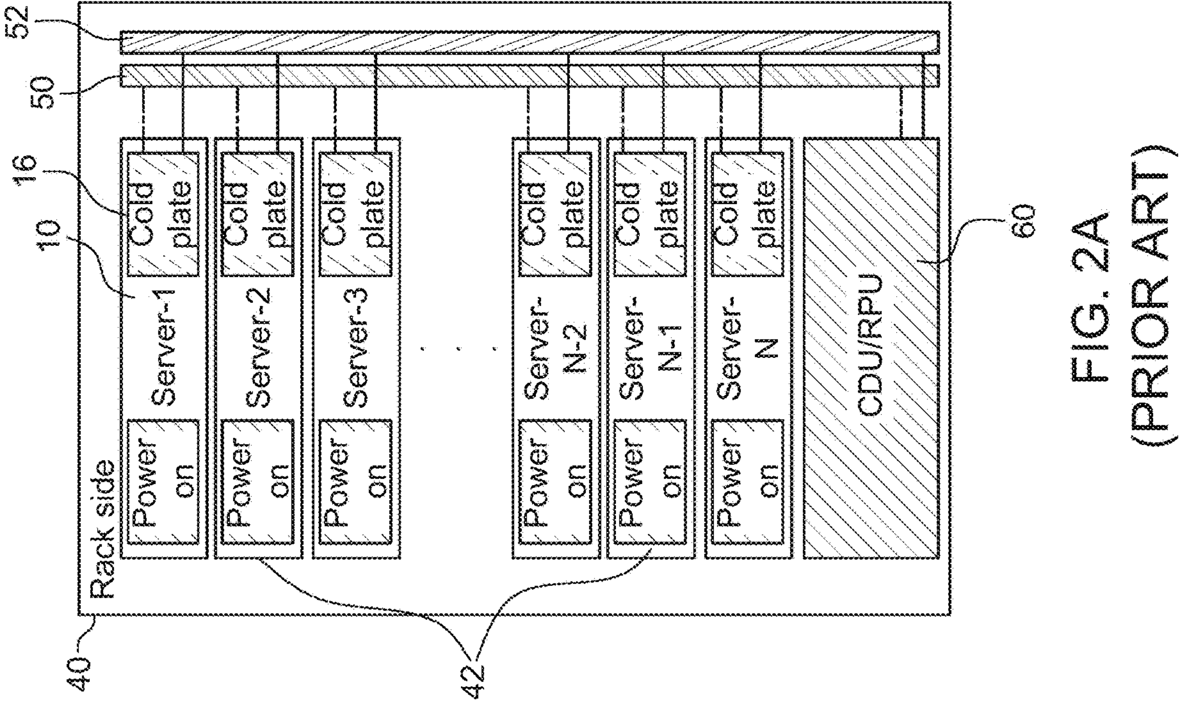
FIG. 2A is a side view of a prior art liquid cooled rack system that includes the server in FIG. 1.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a leak detection and protection system for computer devices connected to a liquid cooling system in a rack. The example leak detection and protection system uses a three-way valve to shut down coolant flow when coolant leaks in an individual computing device on a rack. The computing device with the leak is then shut down to protect the electronic components of the computing device. The remaining computing devices in the rack can maintain operation and be cooled through the liquid cooling system. The ability to shut down a single computing device where a leak is detected prevents the need to shut down all computing devices in the rack.

Figure 3A:
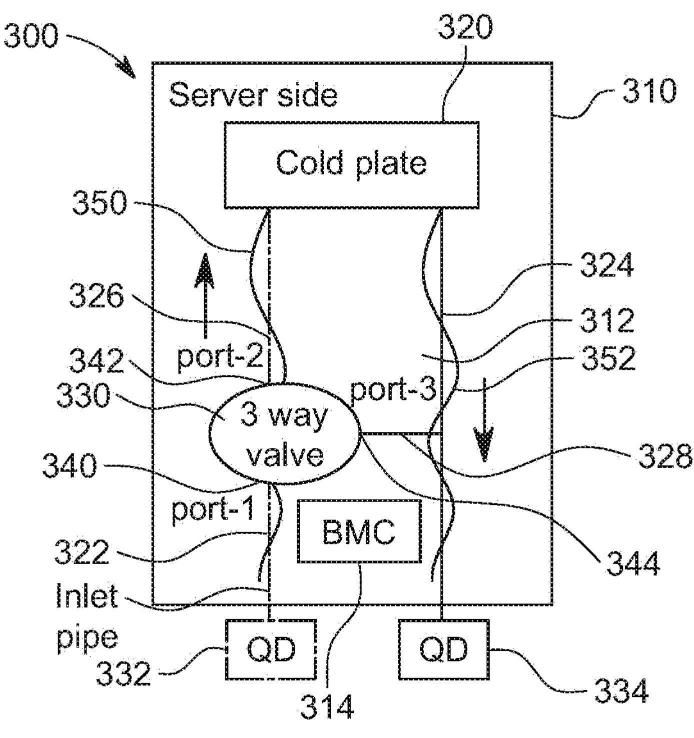
FIG. 3A is a diagram of an example leak detection system in a server chassis in normal operation that allows coolant to flow to a cold plate, according to certain aspects of the present disclosure.

FIG. 3A is a top view of a computing device 300, such as a server, that requires liquid cooling. The computing device 300 includes a chassis 310 that has a motherboard 312 mounting heat generating components such as processor chips, memory modules, and power supplies. The motherboard 312 also includes a server operations controller such as a baseboard management controller (BMC) 314. In this example, a cold plate 320 is mounted over heat-generating electrical components, such as a processor, to transfer heat away from such components. Coolant is circulated internally in the cold plate 320 to carry away heat generated from the processor under the cold plate 320.

The chassis 310 thus encloses electronic components, power supplies, circuit boards, device cards, processors, memory devices, and other elements. In this example, the chassis 310 meets the standard size requirement for a rack component such as being 1U, 2U, or 4U in height. In this example, the computing device 300 may be an application server having processing devices such as CPUs and GPUs. The example coolant leak detection system may be applied to any appropriate computing device such as storage servers, storage devices, routers, network switches and the like.

The chassis 310 includes an inlet coolant tube 322 and an outlet coolant tube 324 that may each be fluidly connected to a rack mounted liquid cooling system. One end of a feeder coolant tube 326 supplies coolant to the cold plate 320. One end of a bypass coolant tube 328 is fluidly coupled to the outlet coolant tube 324. An opposite end of the bypass coolant tube 328 is fluidly coupled to a three-way valve 330. One end of the coolant tube 322 receives coolant from a quick disconnect fitting 332 that is in fluid communication with a cold manifold 440 in FIG. 4. The outlet coolant tube 324 collects heated coolant from the cold plate 320 and returns the heated coolant through one end to a quick disconnect fitting 334 that is in fluid communication with a hot manifold 442.

The three-way valve 330 may be controlled by the BMC 314 to divert coolant between the coolant tubes 322, 326, and 328, as will be explained below. The three-way valve 330 has a first port 340 that is fluidly coupled to an opposite end of the coolant tube 322. A second port 342 is fluidly coupled to an opposite end of the feeder coolant tube 326. A third port 344 is fluidly coupled to an opposite end of the bypass coolant tube 328.

In this example, a pair of cable type leak sensors 350 and 352 are strung out over the surface of the motherboard 312 in respective proximity to the coolant tubes 322, 324 and 326. The leak sensors 350 and 352 are coupled to input ports of the BMC 314. The leak sensors 350 and 352 each have internal positive and negative poles that may be electrically connected by liquid contacting the exterior wall of the sensor. There are two copper-plated coils (positive and negative) in the cable type leak sensors 350 and 352 that are combined with the non-woven fabric of the walls of the sensors. When coolant contacting any part of the exterior wall reaches a threshold volume, such as at least 0.3 ml in volume, the coolant causes conduction between the two poles and changes the resistance of the cable type leak sensor, thus indicating a coolant leak. The change in resistance is detected by the BMC 314. As will be explained, the BMC 314 may be programmed to take actions such as shutting down the computing device 300, generating alerts, and cutting off coolant flow to the computing device 300 via the three-way valve 330 to prevent damage from other key components in the system.

The leak detection and protection system in the example computing device 300 includes the three-way valve 330 which connects the inlet coolant tubes 322 and feeder coolant tube 326 and the outlet coolant tube 324. Thus, the three-way valve 330 may be controlled to allow coolant to flow from the inlet coolant tube 322 into the cold plate 320 through the feeder coolant tube 326. The three-way valve 330 simultaneously blocks coolant from entering the bypass coolant tube 328. The three-way valve 330 is set so coolant flows from the first port 340 to the second port 342 thus allowing coolant to flow to the cold plate 320 via the feeder coolant tube 326. In normal operation shown in FIG. 3A, coolant from an external source such as a CDU/RPU can flow into the cold plate 320 to provide cooling of heat-generating components.

Figure 3B:
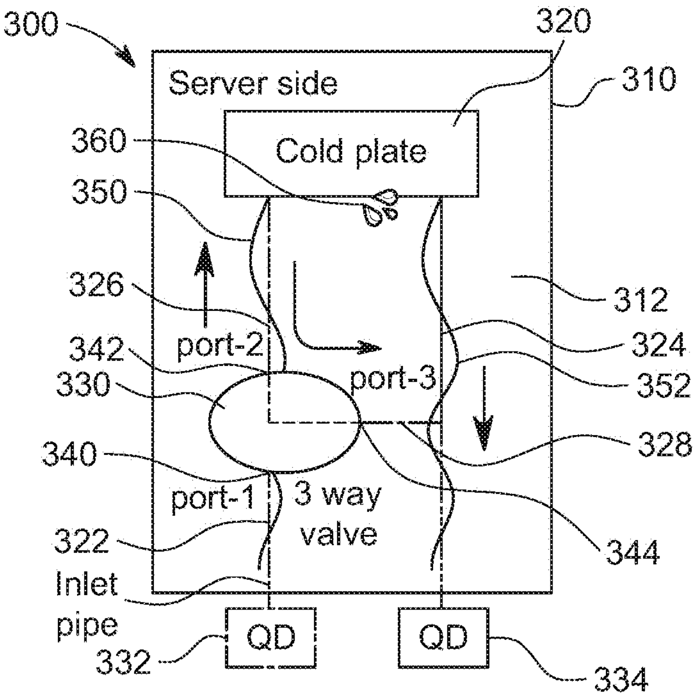
FIG. 3B is a diagram of a three-way valve of the example leak detection system in the server chassis operating to isolate the coolant flow to the server when a leak is detected, according to certain aspects of the present disclosure.

When a leak is detected by one of the leak sensors 350 or 352, the three-way valve 330 is activated to block coolant from the inlet coolant tube 322 from reaching the cold plate 320. FIG. 3B shows the coolant flow when a leak 360 is detected by the BMC 314 reading one of the leak sensors 350 and 352. The BMC 314 activates the three-way valve 330 to route coolant from the second port 342 to the third port 344. The three-way valve 330 blocks coolant flow from the first port 340 to the second port 342. Thus, coolant flowing from the inlet coolant tube 322 is blocked by the three-way valve 330. This prevents further coolant from flowing to the source of the leak, which may be in the cold plate 320 or one of the coolant tubes 324 and 326. The coolant leak will thus be contained by cutting off further coolant flow. The hot manifold 442 connected to the outlet coolant tube 324 provides a suction force to propel the remaining coolant in the cold plate 320 to the quick disconnect fitting 334 either directly through the outlet coolant tube 324 or through the feeder coolant tube 326 and the bypass coolant tube 328. The coolant is therefore drained from the feeder coolant tube 326, the cold plate 320 and most of the outlet coolant tube 324. In this manner, further leaking from the remaining coolant is prevented and the BMC 314 may shutdown power to the processor and all other components in the computing device 300.

Figures 4, 5:
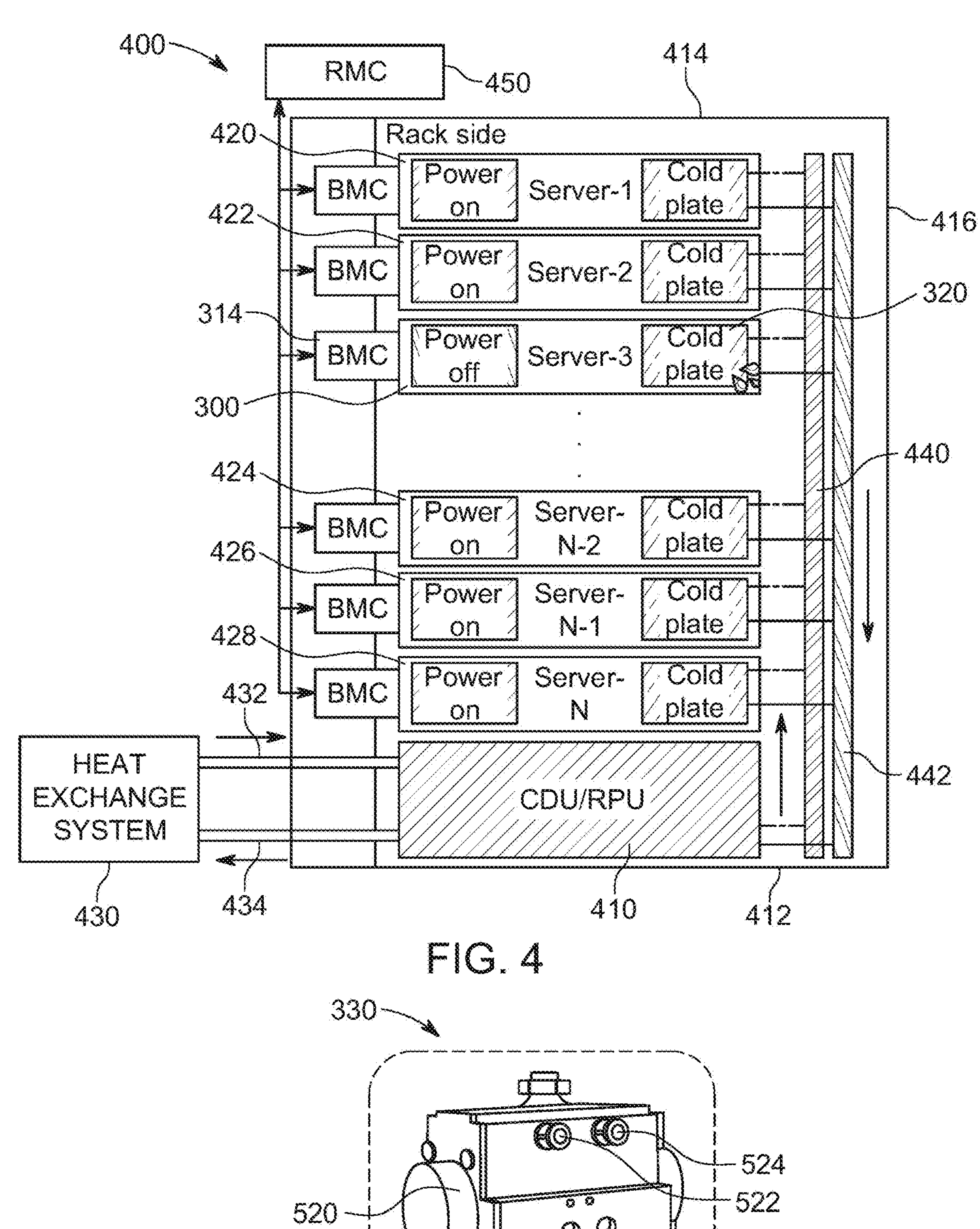
FIG. 4 is a diagram of a rack of servers including the server in FIG. 3A that shows the operational status of the servers when a leak is detected, according to certain aspects of the present disclosure.
FIG. 5 is perspective view of the example three-way valve in FIG. 3A, according to certain aspects of the present disclosure.

FIG. 4 is a partial cutaway side view of an example rack 400 that holds a series of computing devices such as the computing device 300 in FIG. 3A. The rack 400 holds a coolant distribution unit 410 that circulates coolant as part of a rack liquid coolant distribution system. The coolant distribution unit 410 is fluidly coupled to a heat exchanger 430 via two supply hoses 432 and 434. The external heat exchanger 430 cools the collected coolant through an air cooling system and returns coolant to the coolant distribution unit 410.

The rack 400 includes a rectangular bottom frame 412 that may include a set of wheels to allow the rack 400 to be moved to desired locations in a data center. Side members of the bottom frame support vertical supports that defining one side of the rack 400. Similar opposite vertical supports are provided on the other side of the rack 400. A top panel 414 connects the sides. The top panel 414 holds lateral bracing members that connect the vertical supports of the opposite sides. Each of the vertical supports may include holes to allow pins to be inserted. The pins may support shelves that may be installed between the opposing vertical supports. A rear door 416 may be opened to allow access to the rear sides of the computing devices held in the rack 400. In this example, the heat exchanger 430 is external to the rack 400 and may serve to provide coolant to multiple racks. Alternatively, the rear door 416 may support a heat exchanger that may be part of the liquid cooling system of the rack 400 allowing the liquid cooling loop to be self-contained in the rack 400. The coolant distribution unit 410 is mounted on the bottom frame 412. The coolant distribution unit 410 may have replaceable modules such as pumps that may be inserted from the front end of the rack 400.

The rack 400 holds example computing devices 420, 422, 424, 426, and 428 that may be identical to the computing device 300 or be different components such as storage servers, storage devices, routers, network switches and the like. Although several computing devices are shown for ease of illustration, it is understood that the rack 400 may hold numerous computing devices that are stacked over the coolant distribution unit 410. Each of the shelves attached to the vertical supports may hold one or more of the computing devices. The shelves may be arranged to have different heights between the shelves. It is understood that any number of shelves and corresponding computing devices may be installed in the rack 400.

The rack 400 supports a cold manifold 440 and a hot manifold 442, each of which extends over the height of the rack 400. The cold manifold 440 is fluidly connected to the coolant distribution unit 410. The hot manifold 442 is also fluidly connected to the coolant distribution unit 410. Each of the manifolds 440 and 442 can allow coolant to circulate along the respective length of the manifold. The manifolds 440 and 442 have fluid couplers spaced at periodic intervals that allow fluid communication to one of the computing devices 300, 420, 422, 424, 426, and 428 via quick disconnect fittings 332 and 334.

In this example, the individual computing device 300 may be inserted on a shelf of the rack 400. Once in place, the inlet coolant tube 322 in FIG. 3 is fluidly connected with one of the fluid couplers of the cold manifold 440, and the outlet coolant tube 324 is fluidly connected with one of the fluid couplers of the hot manifold 442. The computing device 300 is also connected to a power supply for power and other cables for carrying data signals. After connection to the liquid cooling system and electrical systems, the computing device 300 is ready for power on.

Each individual computing device such as the computing device 300 includes a BMC, such as the BMC 314 that manages operations for the respective computing device. Each BMC may be connected to a management network that includes a rack management controller 450. The rack management controller 450 receives operational data from each of the computing devices through the management network. The rack management controller 450 may communicate to each BMC individually to control the respective computing device.

The heat exchanger 430 in this example is part of the liquid cooling system and includes a series of radiators that receive the heated coolant from the hot manifold 442. The radiators allow the heated coolant to be cooled via a series of fans that are mounted in proximity to each of the radiators. The cooled coolant exits from the radiators and is routed back to the coolant distribution unit 410 for distribution to the cold manifold 440.

The manifolds 440 and 442 circulate coolant to the computing devices such as the computing device 300 through a closed loop formed with the coolant distribution unit 410 and the heat exchanger 430. Thus, the coolant liquid will flow into the computing device 300 from one of the fluid couplers on the cold manifold 440. The coolant will circulate through the internal conduits of the cold plate 320 or cold plates in the computing device 300 to absorb heat from the heat-generating devices, and flow out of the computing device through a fluid coupler to the hot manifold 442. The heated coolant will be circulated to the heat exchanger 430. The heat exchanger 430 removes the heat from the heated coolant via the radiators and a fan wall. The cooled coolant is routed to the coolant distribution unit 410. The coolant distribution unit 410 includes a reservoir to store coolant and pumps to circulate the coolant through the manifolds 440 and 442 and the heat exchanger 430. The pumps in the coolant distribution unit 410 provide pressure to circulate the cooled coolant to the cold manifold 440.

FIG. 4 shows a scenario where a leak is detected in the computing device 300 in the rack 400. As explained above, the three-way valve 330 in FIG. 3A may be employed to prevent coolant from flowing into cold plate 320 after the leak is detected. An alert regarding the leak is communicated by the BMC 314 in FIG. 3A to the rack management controller 450 on the rack 400. When a leak occurs, only the computing device with the leak needs to be shut down. The example leak detection and protection system allows other computing devices in the rack to operate normally despite the leak. In this example, the remaining computing devices 420, 422, 424, 426, and 428 remain in operation while the computing device 300 is shut down. The example leak detection and protection system protects the remaining computing devices 420, 422, 424, 426, and 428 as coolant is removed from the now shut down computing device 300. The rack management controller 450 may communicate an alert to an administrator to inspect or replace the computing device 300 where the leak has been detected.

FIG. 5 shows a perspective view of the example three-way valve 330 in FIG. 3. In this example the three-way valve 330 has a main body 510 that seats an internal ball valve. The ball valve may be rotated via shaft 512 extending from the main body 510. The main body 510 includes the three ports 340, 342, and 344. Each of the ports 340, 342, and 344 may be connected to an open end of a coolant tube. The shaft 512 is rotated by a motor held in a motor housing 520. The motor housing 520 has electrical connector contacts 522 and 524 for power to drive the motor. Other contacts may be provided to receive control signals from a controller such as the BMC 314 in FIG. 3A.

Figure 6A:
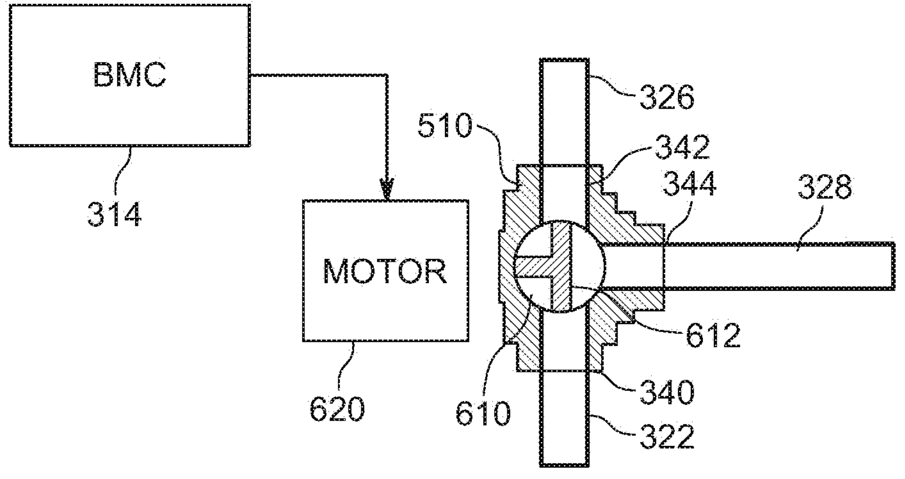
FIG. 6A is a block diagram of the example three-way valve in FIG. 3A and corresponding coolant tubes when the leak protection system is in normal operation, according to certain aspects of the present disclosure.

FIG. 6A is a cutaway view of the three-way valve 330 in normal operation. As explained above, the three-way valve 330 includes an internal ball valve 610 that include a T-shaped internal conduit 612. The ball valve 610 is seated inside the main body 510. Each of the ports 340, 342 and 344 allow fluid access to the ball valve 610. The openings of the conduit 612 may be aligned with the ports 340, 342, 344, or be sealed off depending on the rotation of the ball valve 610. A motor 620 controls the rotation of the ball valve 610. In this position, the motor 620 keeps the ball valve 610 in position such that two ends of the conduit 612 are aligned with the ports 340 and 342. Coolant is thus allowed to flow through the ball valve 610 between the coolant tube 322 and the feeder tube 326. The third end of the conduit 612 is aligned to the side of the interior seat of the valve body 510 and thus prevents coolant from flowing to the port 344.

Figure 6B:
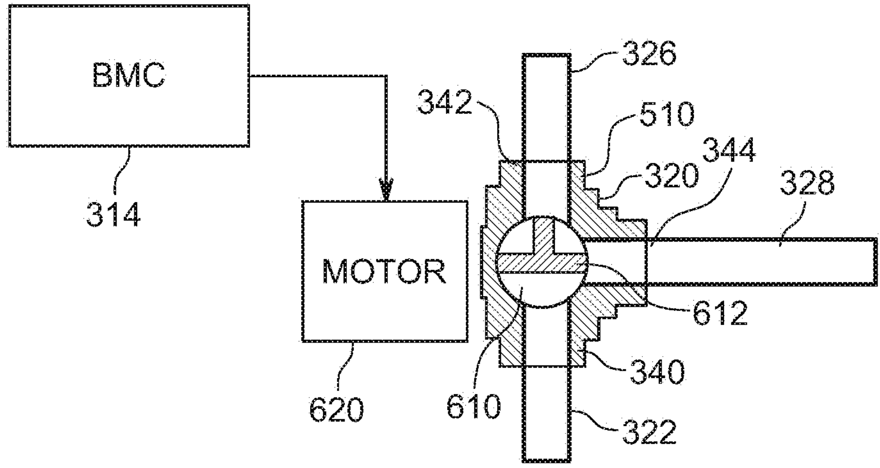
FIG. 6B is a block diagram of the example three-way valve in FIG. 3A and corresponding coolant tubes when the three-way valve is controlled to prevent coolant flow on detection of a leak, according to certain aspects of the present disclosure.

FIG. 6B is a cutaway view of the position of the three-way valve 330 when a leak is detected. In this example, the ball valve 610 is rotated by the motor 620 so the conduit 612 only allows fluid communication between ports 342 and 344. Thus, the ball valve 610 blocks any coolant from flowing from the coolant tube 322 and the port 340. As explained above, coolant from the cold plate 320 coupled to the feeder coolant tube 326 is returned through the bypass coolant tube 328 to the outlet coolant tube 324 in FIG. 3B. In this matter, existing coolant is drained from the cold plate 320, while the three-way valve 330 prevents additional coolant from entering the cold plate 320, thus protecting the components of the computing device.

Figure 7:
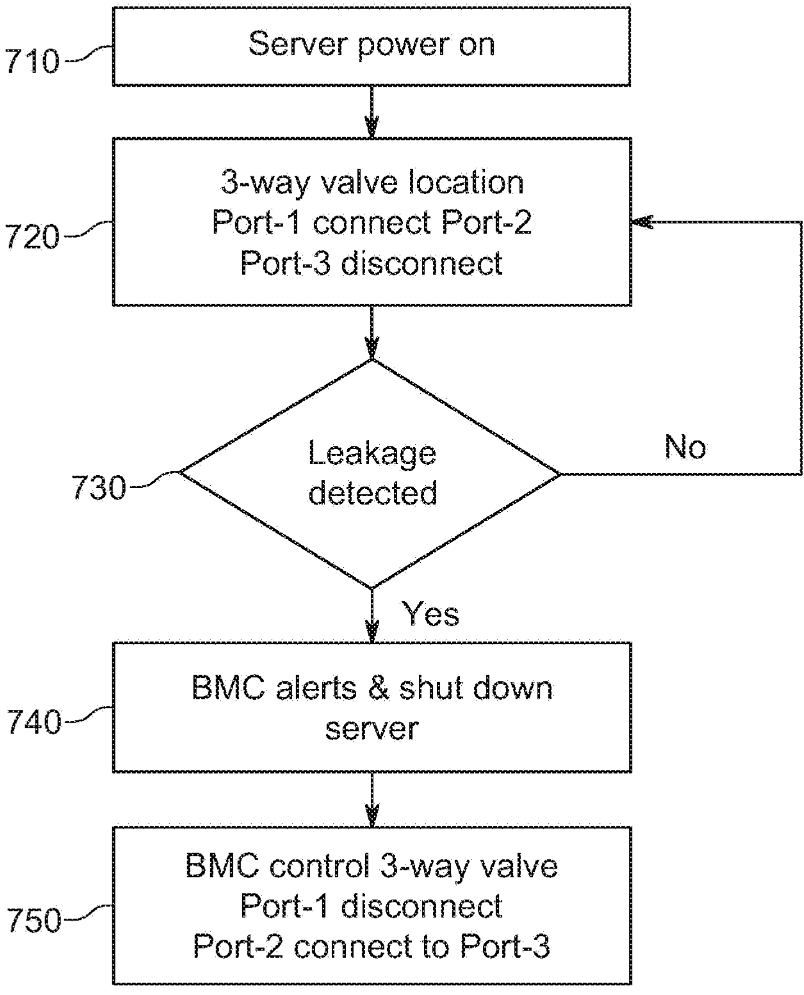
FIG. 7 is a flow diagram of a routine run by a controller to ensure a single server is shutdown when a leak is detected to isolate that server but allow other servers to continue to operate.

FIG. 7 is a flow diagram of the routine to detect leaks and close coolant flow to a computing device. In this example, the routine is executed by the BMC 314. The machine readable instructions comprise an algorithm for execution by: (a) a processor, (b) a controller, and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application specific integrated circuit [ASIC], a programmable logic device [PLD], a field programmable logic device [FPLD], a field programmable gate array [FPGA], discrete logic, etc.). For example, any or all of the components of the interfaces can be implemented by software, hardware, and/or firmware. Also, some or all of the machine readable instructions represented by the flowcharts may be implemented manually. Further, although the example algorithm is described with reference to the flowcharts illustrated in FIG. 7, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The routine first detects the computing device 300 powering on (710). The routine then controls the three-way valve 330 in FIG. 3A such that the first port 340 allows fluid communication to connect to the second port 342 (720). Thus, coolant may flow from the cold coolant manifold 440 to the cold plate 320. The BMC 314 will periodically read signals from leak detection sensors such as the cable sensors 350 and 352 in FIG. 3A and monitor if any leaks are detected. If no leaks are detected (730), the routine will loop back to maintain the three-way valve 330 in the normal position (740).

If a leak is detected (730), the BMC 314 will send an alert signal to the RMC 450 via a network communication on the management network (740). The RMC 450 may alert an administrator of the leak via a network interface coupled to an external network. The BMC 314 will also shut down the computing device to protect the electronic components from the leak. The BMC 314 will position the three-way valve 330 to block the first port 340. The position of the three-way valve 330 connects the second port 342 to the third port 344. In this manner, coolant flow is shut off to the cold plate 320, thus preventing further leaks. Remaining coolant may be collected by the outlet coolant tube 324 via suction generated in the hot manifold 442. As explained above, the other servers in the rack can continue to operate normally, as the liquid cooling is still available through the CDU/RPU 410 and manifolds 440 and 442 in FIG. 4.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A coolant leak detection and protection system comprising:

an inlet coolant tube for supplying a coolant from a coolant source;

a feeder coolant tube for supplying the coolant to a cold plate;

an outlet coolant tube having a first end for collecting the coolant from the cold plate and an opposite second end for propelling the coolant to a collection manifold, the outlet coolant tube being fluidly connected to a first end of a bypass tube;

a three-way valve having a first port coupled to the inlet coolant tube, a second port coupled to the feeder coolant tube, and a third port coupled to a second opposite end of the bypass tube;

a leak sensor; and a controller coupled to the leak sensor and the three-way valve, the controller operable to detect a leak based on a signal from the leak sensor, control the three-way valve to fluidly connect the first port to the second port in normal operation, and control the three-way valve to fluidly connect the second port to the third port to cut off coolant flow from the inlet coolant tube when the leak is detected, wherein the coolant in the cold plate is drained through the outlet coolant tube to the collection manifold when the three-way valve is controlled to cut off coolant flow from the inlet coolant tube.

2. The coolant leak detection and protection system of claim 1, wherein the three-way valve is a ball valve.

3. The coolant leak detection and protection system of claim 2, wherein the three-way valve includes a motor rotating the ball valve.

4. The coolant leak detection and protection system of claim 1, wherein the leak sensor is cable type leak detector.

5. The coolant leak detection and protection system of claim 1, wherein the controller shuts down a computing device when the leak is detected.

6. The coolant leak detection and protection system of claim 1, wherein the controller is a baseboard management controller in communication with a rack management controller.

7. A computing device comprising:

a heat generating component;

a cold plate in thermal contact with the heat generating component;

an inlet coolant tube for supplying a coolant from a coolant source;

a feeder coolant tube for supplying the coolant to the cold plate;

an outlet coolant tube having a first end for collecting the coolant from the cold plate and an opposite second end for propelling the coolant to a collection manifold, the outlet coolant tube being fluidly connected to a first end of a bypass tube;

a three-way valve having a first port coupled to the inlet coolant tube, a second port coupled to the feeder coolant tube, and a third port coupled to a second opposite end of the bypass tube;

a leak sensor; and a controller coupled to the leak sensor and the three-way valve, the controller operable to detect a leak based on a signal from the leak sensor, control the three-way valve to fluidly connect the first port to the second port in normal operation, and control the three-way valve to fluidly connect the second port to the third port to cut off coolant flow from the inlet coolant tube when the leak is detected, wherein the coolant in the cold plate is drained through the outlet coolant tube to the collection manifold when the three-way valve is controlled to cut off coolant flow from the inlet coolant tube.

8. The computing device of claim 7, wherein the controller is a baseboard management controller in communication with a rack management controller.

9. The computing device of claim 7, wherein the three-way valve is a ball valve.

10. The computing device of claim 9, wherein the three-way valve includes a motor rotating the ball valve.

11. The computing device of claim 7, wherein the leak sensor is cable type leak detector.

12. The computing device of claim 7, wherein the controller shuts down the heat generating component when the leak is detected.

13. The computing device of claim 7, wherein the computing device is one of an application server, a storage server, a storage device, or a network switch.

14. The computing device of claim 7, wherein the heat generating component is one of a central processing unit (CPU), a graphic processing unit (GPU), or a memory module.

15. A rack for holding computing devices requiring liquid cooling, the rack comprising:

- a cold coolant manifold having a plurality of fluid couplers;
- a hot coolant manifold having a plurality of fluid couplers;
- a coolant distribution unit supplying cold coolant to the cold coolant manifold and collecting hot coolant from the hot coolant manifold; and
- a plurality of computing devices, each including:
  - a heat generating component;
  - a cold plate in thermal contact with the heat generating component;
  - an inlet coolant tube coupled to one of the fluid couplers of the cold coolant manifold for supplying a coolant;
  - a feeder coolant tube for supplying the coolant to the cold plate;
  - an outlet coolant tube having a first end coupled to one of the fluid couplers of the hot coolant manifold and an opposite second end for collecting the coolant from the cold plate, the outlet coolant tube being fluidly connected to first end of a bypass tube;
  - a three-way valve having a first port coupled to the inlet coolant tube, a second port coupled to the feeder coolant tube, and a third port coupled to a second opposite end of the bypass tube;
  - a leak sensor; and
  - a controller coupled to the leak sensor and the three-way valve, the controller operable to determine a leak based on a signal from the leak sensor, control the three-way valve to fluidly connect the first port to the second port in normal operation, and control the three-way valve to fluidly connect the second port to the third port to cut off coolant flow from the inlet coolant tube when a leak is detected, wherein the coolant in the cold plate is drained through the outlet coolant tube to the collection manifold when the three-way valve is controlled to cut off coolant flow from the inlet coolant tube.

16. The rack of claim 15, further comprising a rack management controller in network communication with each of the controllers of the plurality of computing devices, wherein each controller is a baseboard management controller.

17. The rack of claim 16, wherein when a controller of a computing device of the plurality of computing devices detects a leak, the controller alerts the rack management controller and wherein the remaining computing devices continue to operate.

18. The rack of claim 15, wherein the computing devices are one of an application server, a storage server, a storage device, or a network switch.

19. The rack of claim 15, wherein the heat generating component is one of a central processing unit (CPU), a graphic processing unit (GPU), or a memory module.

20. The rack of claim 15, wherein the three-way valve includes a motor rotating a ball valve.

* * * * *